[12] United States Patent
Xu et al.

(10) Patent No.: US 9,350,454 B2
(45) Date of Patent: May 24, 2016

(54) MULTI-LASER TRANSMITTER OPTICAL SUBASSEMBLY

(75) Inventors: Xiaojie Xu, Pleasanton, CA (US); Bernd Huebner, Santa Clara, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 793 days.

(21) Appl. No.: 13/011,741

(22) Filed: Jan. 21, 2011

(65) Prior Publication Data

US 2012/0189314 A1 Jul. 26, 2012

(51) Int. Cl.
| | |
|---|---|
| H04B 10/00 | (2013.01) |
| G02B 27/10 | (2006.01) |
| H04B 10/50 | (2013.01) |
| G02B 6/42 | (2006.01) |
| G02B 6/293 | (2006.01) |
| H01S 5/40 | (2006.01) |

(52) U.S. Cl.
CPC ............ H04B 10/506 (2013.01); G02B 6/4215 (2013.01); G02B 6/29367 (2013.01); H01S 5/4012 (2013.01)

(58) Field of Classification Search
CPC ..... H04B 10/56; H04J 14/02; G02B 6/29367; G02B 6/2938; G02B 6/32; G02B 6/2931; G02B 19/0028; G02B 27/0905; G02B 27/283
USPC .................... 398/43, 79, 82–88, 91
See application file for complete search history.

(56) References Cited

U.S. PATENT DOCUMENTS

| | | | | |
|---|---|---|---|---|
| 4,244,045 A | * | 1/1981 | Nosu .................. | G02B 6/29367 398/86 |
| 4,718,056 A | * | 1/1988 | Schultheiss .......... | G02B 6/2931 385/33 |
| 4,838,631 A | * | 6/1989 | Chande ................ | B23K 26/067 219/121.75 |
| 5,822,096 A | * | 10/1998 | Redmond ................ | G02B 6/43 359/634 |
| 5,844,707 A | * | 12/1998 | Minakuchi et al. ........ | 359/204.1 |
| 6,563,976 B1 | * | 5/2003 | Grann ................ | G02B 6/29311 385/24 |
| 6,829,096 B1 | * | 12/2004 | Wade .................... | G02B 5/1814 359/566 |
| 7,027,734 B1 | * | 4/2006 | Wu et al. .......................... | 398/79 |
| 7,260,328 B2 | * | 8/2007 | Kropp ............................. | 398/82 |
| 7,366,371 B1 | * | 4/2008 | Wen ..................... | G02B 6/4214 385/15 |
| 7,646,991 B2 | * | 1/2010 | Gorrell .................... | H01J 25/00 398/182 |
| 8,351,791 B1 | * | 1/2013 | Wang et al. ...................... | 398/85 |
| 8,540,437 B2 | * | 9/2013 | Lee ....................... | G02B 6/4215 385/31 |
| 9,008,515 B2 | * | 4/2015 | Neilson ..................... | G02B 5/20 398/183 |
| 2003/0108353 A1 | * | 6/2003 | Nasu ................... | H01S 5/02248 398/91 |

(Continued)

OTHER PUBLICATIONS

Du et al., U.S. Appl. No. 13/011,770, filed Jan. 21, 2011, Multi-Laser Transmitter Optical Subassemblies for Optoelectronic Modules.

(Continued)

*Primary Examiner* — David Payne
*Assistant Examiner* — Tanya Motsinger
(74) *Attorney, Agent, or Firm* — Maschoff Brennan

(57) ABSTRACT

Multi-laser transmitter optical subassembly (TOSA). In one example embodiment, a method of fabricating a multi-laser TOSA includes various acts. First, first and second optical signals are transmitted from first and second lasers, respectively. Next, the angle of a first collimating lens is actively adjusted to cause the second optical signal to be aligned with the first optical signal as the first optical signal passes through a first filter and as the second optical signal is reflected by the first filter such that the first and second optical signals are aligned and combined.

15 Claims, 3 Drawing Sheets

(56) References Cited

U.S. PATENT DOCUMENTS

| | | | |
|---|---|---|---|
| 2005/0117913 A1* | 6/2005 | Hung et al. | 398/139 |
| 2006/0067629 A1* | 3/2006 | Hata | G02B 6/2746 385/83 |
| 2006/0088255 A1* | 4/2006 | Wu | G02B 6/2938 385/92 |
| 2006/0251422 A1* | 11/2006 | Liu | H04J 14/02 398/79 |
| 2007/0207670 A1* | 9/2007 | Stewart et al. | 439/607 |
| 2008/0019010 A1* | 1/2008 | Govorkov | B23K 26/0613 359/641 |
| 2010/0061730 A1* | 3/2010 | Seki | G02B 6/4246 398/79 |
| 2011/0091219 A1* | 4/2011 | Tatum et al. | 398/142 |
| 2011/0157706 A1* | 6/2011 | Mitra | G02B 27/0905 359/619 |
| 2012/0189306 A1* | 7/2012 | Du et al. | 398/65 |
| 2012/0189314 A1* | 7/2012 | Xu | H04B 10/506 398/135 |
| 2013/0057834 A1* | 3/2013 | Yoshida | B23P 11/00 353/38 |
| 2014/0321856 A1* | 10/2014 | Saeki | H04B 10/501 398/79 |
| 2015/0236479 A1* | 8/2015 | Seki | H01S 5/4012 359/641 |

OTHER PUBLICATIONS

Xu et al., U.S. Appl. No. 13/011,765, filed Jan. 21, 2011, Multi-Laser Transmitter Optical Subassembly.

\* cited by examiner

MULTI-LASER TRANSMITTER OPTICAL SUBASSEMBLY

BACKGROUND

Optoelectronic modules, such as optoelectronic transceiver or transponder modules, are increasingly used in electronic and optoelectronic communication. Some modules can be plugged into a variety of host networking equipment. Modules typically communicate with a printed circuit board of a host device by transmitting electrical signals to the printed circuit board and receiving electrical signals from the printed circuit board. These electrical signals can then be transmitted by the module outside the host device as optical signals.

Multi-source agreements (MSAs), such as the C Formfactor Pluggable (CFP) MSA and the Quad Small Formfactor Pluggable (QSFP) MSA, specify, among other things, housing dimensions for modules. Conformity with an MSA allows a module to be plugged into host equipment designed in compliance with the MSA.

Optical signals are typically generated within a transmitter optical subassembly (TOSA) of a module using a laser, such as a vertical cavity surface emitting laser (VCSEL) or a distributed feedback (DFB) laser. As data rates in modules increase, two or more lasers are often included in a single TOSA. However, as MSAs specify increasingly smaller module housing dimensions, there is less available space for multi-laser TOSAs within the module housing. In addition, multi-laser TOSAs are often relatively expensive and often suffer from relatively high optical loss.

BRIEF SUMMARY OF SOME EXAMPLE EMBODIMENTS

In general, example embodiments of the invention relate to a multi-laser transmitter optical subassembly (TOSA). The example multi-laser TOSA disclosed herein may be used in an optoelectronic module, for example. The example multi-laser TOSA disclosed herein exhibits a relatively small size, cost, and optical loss, thus enabling relatively improved overall performance of the optoelectronic module into which the multi-laser TOSA is integrated.

In one example embodiment, a multi-laser TOSA includes first, second, third, and fourth lasers configured to generate first, second, third, and fourth optical signals having first, second, third, and fourth wavelengths, respectively; a mirror; first, second, and third filters having first, second, and third filter surfaces facing the mirror; first, second, third, and fourth collimating lenses defining first, second, third, and fourth axes, respectively; and a focusing lens. Two or more of the axes are not parallel. The first, second, third, and fourth collimating lenses are each individually aligned to collimate and transmit the first, second, third, and fourth optical signals, respectively. The first collimating lens is configured to align the first optical signal with the second optical signal passing through the first filter. The first filter is configured to combine the first and second optical signals. The second collimating lens is configured to align the second optical signal with the third optical signal passing through the second filter. The second filter is configured to combine the first, second, and third optical signals. The third collimating lens is configured to align the third optical signal with the fourth optical signal passing through the third filter. The third filter is configured to both combine the first, second, third, and fourth optical signals and transmit the combined first, second, third, and fourth optical signals toward the focusing lens.

In another example embodiment, an optoelectronic transceiver module includes a printed circuit board, a receiver optical subassembly (ROSA) in electrical communication with the printed circuit board, and a multi-laser TOSA in electrical communication with the printed circuit board. The multi-laser TOSA includes first, second, third, and fourth lasers configured to generate first, second, third, and fourth optical signals having first, second, third, and fourth wavelengths, respectively; a mirror; first, second, and third filters having first, second, and third filter surfaces facing the mirror; first, second, third, and fourth collimating lenses defining first, second, third, and fourth axes, respectively; and a focusing lens. Two or more of the axes are not parallel. The first, second, third, and fourth collimating lenses are each individually aligned to collimate and transmit the first, second, third, and fourth optical signals, respectively. The first collimating lens is configured to align the first optical signal with the second optical signal passing through the first filter. The first filter is configured to combine the first and second optical signals. The second collimating lens is configured to align the second optical signal with the third optical signal passing through the second filter. The second filter is configured to combine the first, second, and third optical signals. The third collimating lens is configured to align the third optical signal with the fourth optical signal passing through the third filter. The third filter is configured to both combine the first, second, third, and fourth optical signals and transmit the combined first, second, third, and fourth optical signals toward the focusing lens.

In yet another example embodiment, a method of fabricating a multi-laser TOSA includes various acts. First, first and second optical signals are transmitted from first and second lasers, respectively. Next, the angle of a first collimating lens is actively adjusted to cause the second optical signal to be aligned with the first optical signal as the first optical signal passes through a first filter and as the second optical signal is reflected by the first filter such that the first and second optical signals are aligned and combined.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Example embodiments of the present invention relate to a multi-laser transmitter optical subassembly (TOSA). The example multi-laser TOSA disclosed herein may be used in an optoelectronic module, for example. The example multi-laser TOSA disclosed herein exhibits a relatively small size, cost, and optical loss, thus enabling relatively improved overall performance of the optoelectronic module into which the multi-laser TOSA is integrated.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Optoelectronic Module

Figure 1:
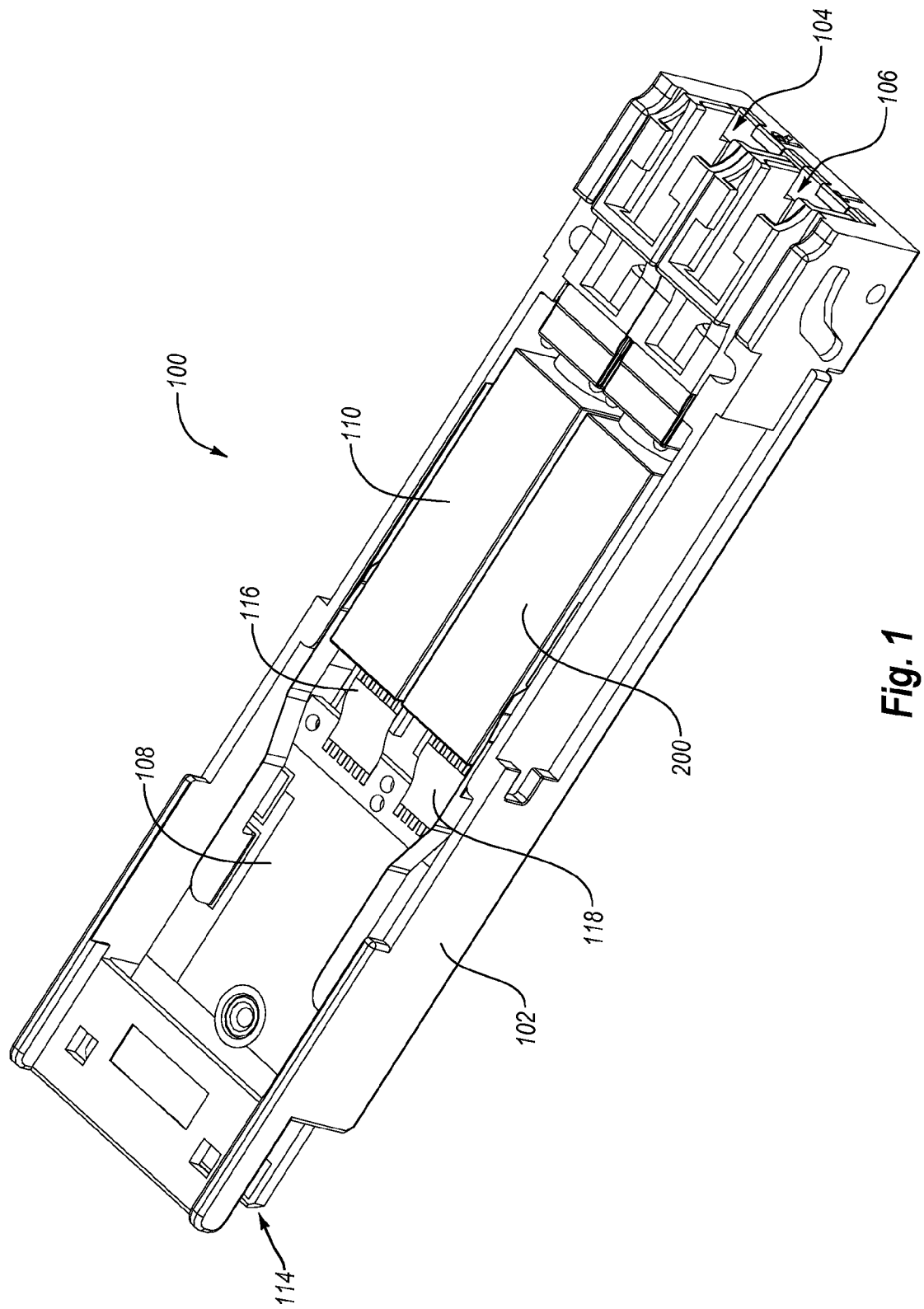
FIG. 1 is a perspective view of an example optoelectronic module and associated multi-laser transmitter optical subassembly (TOSA)

Reference is first made to FIG. 1 which discloses an example optoelectronic module 100 for use in transmitting and receiving optical signals in connection with a host device (not shown). The module 100 is one environment in which example embodiments of the invention can be practiced. As disclosed in FIG. 1, the module 100 includes various components, including a bottom housing 102 configured to mate with a top housing (not shown), a receive port 104 and a transmit port 106 defined in the bottom housing 102, a printed circuit board (PCB) 108 positioned within the bottom housing 102, a receiver optical subassembly (ROSA) 110, and a multi-laser TOSA 200. An edge connector 114 is located on an end of the PCB 108 to enable the module 100 to electrically interface with a host device (not shown). As such, the PCB 108 facilitates electrical communication between the ROSA 110/TOSA 200 and the host device.

The module 100 can be configured for optical signal transmission and reception at a variety of data rates including, but not limited to, 40 Gb/s, 100 Gb/s, or higher. Furthermore, the module 100 can be configured for optical signal transmission and reception at various distinct wavelengths using wavelength division multiplexing (WDM) in which multiple optical signals having distinct wavelengths are multiplexed onto a single optical fiber. For example, the module 100 can be configured to operate using one of various WDM schemes, such as Coarse WDM (CWDM), Dense WDM (DWDM), Light WDM (LWDM), or Local Area Network WDM (LAN WDM). Further, the module 100 can be configured to support various communication protocols including, but not limited to, Fibre Channel and High Speed Ethernet. In addition, although the example module 100 is configured to have a form factor that is substantially compliant with the QSFP MSA, the module 100 can alternatively be configured in a variety of different form factors that are substantially compliant with other MSAs including, but not limited to, the CFP MSA.

With continued reference to FIG. 1, the ROSA 110 houses an optical receiver such as a photodiode or multiple photodiodes (not shown) that are electrically coupled to an electrical interface 116. The TOSA 200 houses multiple optical transmitters such as lasers (not shown) that are electrically coupled to the other electrical interface 118. The optical receiver is configured to convert optical signals received through the receive port 104 into corresponding electrical signals that are relayed to the PCB 108. The optical transmitter is configured to convert electrical signals received through the PCB 108 from a host device (not shown) into corresponding optical signals that are transmitted through the transmit port 106. Accordingly, the ROSA 110 serves as an optical-electronic transducer and the TOSA 200 serves as an electronic-optical transducer. The optical ports 104 and 106 are configured to optically connect the optical receiver and the optical transceiver, respectively, with optical fibers and corresponding optical fiber connectors such as LC or SC connectors (not shown) that are connected to the optical ports.

Having described a specific environment with respect to FIG. 1, it will be understood that this specific environment is only one of countless architectures in which example embodiments of the present invention may be employed. For example, example embodiments of the multi-laser TOSA 200 can be employed in any optoelectronic transceiver, transmitter, or optical engine. The scope of the present invention is not intended to be limited to any particular environment.

2. Example Multi-Laser TOSA

Figure 2:
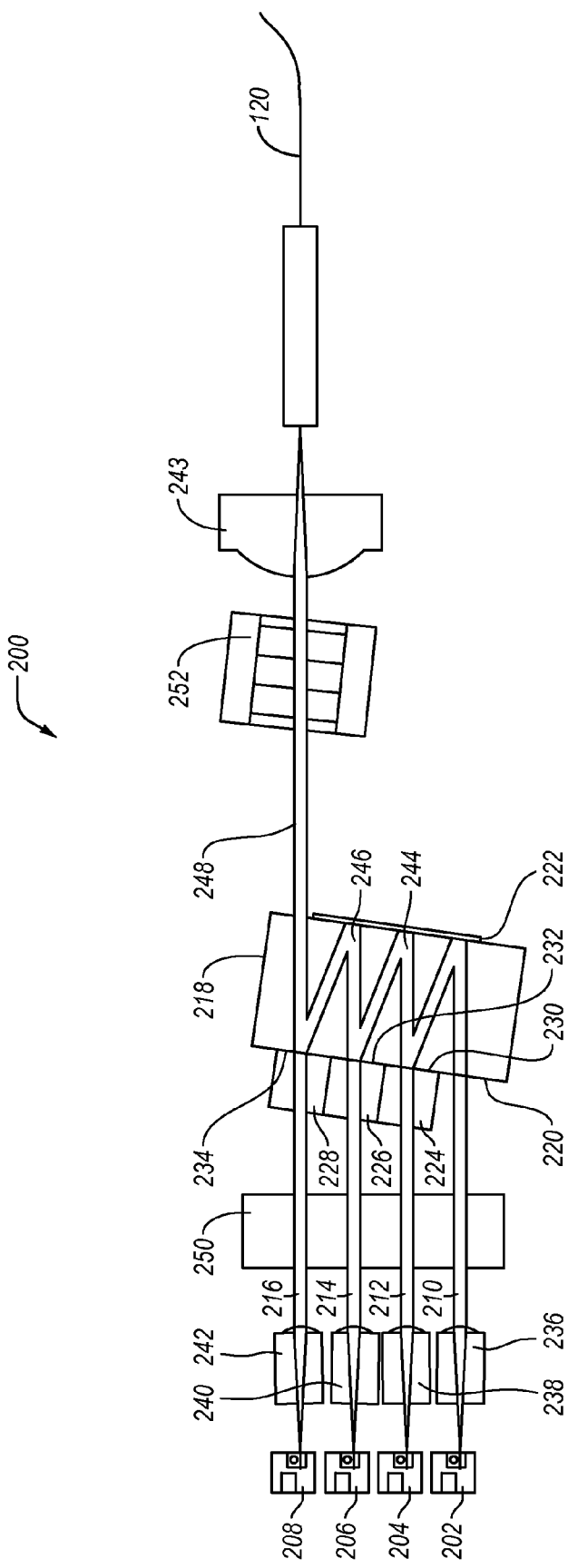
FIG. 2 is a schematic view of the example multi-laser TOSA of FIG. 1.

With reference now to FIG. 2, additional aspects of the example multi-laser TOSA 200 are disclosed. The TOSA 200 can be employed in a WDM environment in order to increase the data throughput on a single optical fiber 120. The optical fiber 120 may be single-mode or multi-mode optical fiber. Although not shown in FIG. 2, it is understood that the various components of the example TOSA 200 can be hermetically sealed within a package.

As disclosed in FIG. 2, the TOSA 200 includes first, second, third, and fourth lasers 202-208 configured to generate first, second, third, and fourth optical signals 210-216, respectively. The lasers 202-208 may be distributed feedback lasers (DFBs), for example. Each of the optical signals 210-216 has a distinct wavelength. The TOSA 200 also includes a WDM block 218 having a first surface 220 that is optically transmissive and a second surface 222 that has a mirrored coating (making the mirrored surface 222 a mirror); first, second, and third filters 224-228 having first, second, and third filter surfaces 230-234, respectively; first, second, third, and fourth collimating lenses 236-242; and the focusing lens 243. The first, second, and third filters 224-228 may be thin film filters, for example. The first, second, and third filter surfaces 230-234 of the first, second, and third filters 224-228 may be attached to the first surface 220 of the WDM block 218. In some example embodiments, the first surface 220 may be a substantially planar surface such that first, second, and third filter surfaces 230-234 are substantially positioned in the same plane. Similarly, the second surface 222 may be a substantially planar surface. Also, the first and second surfaces 220 and 222 may be substantially parallel to each other. The WDM block 218 may be preassembled by attaching the filters 230-234 to the first surface 220 and applying the mirrored coating to the second surface 222 prior to incorporating the WDM block 218 into the TOSA 200.

The second, third, and fourth collimating lenses 238-242 are each individually and precisely aligned with the first, second, and third filter surfaces 232-236, respectively. Being individually and precisely aligned, the axes of the second, third, and fourth collimating lenses 238-242 may not be parallel.

The fourth collimating lens 242 collimates and transmits the fourth optical signal 216 toward the third filter surface 234 of the third filter 228. The third collimating lens 240 collimates and transmits the third optical signal 214 toward the second filter surface 232 of the second filter 226. The third collimating lens 240 is individually aligned in order to align the third optical signal 214, once reflected by the mirrored surface 222, with the fourth optical signal 216 passing through the third filter surface 234 of the third filter 228.

The second collimating lens 238 collimates and transmits the second optical signal 212 toward the first filter surface 230 of the first filter 224. The second collimating lens 238 is individually aligned in order to align the second optical signal 212, once reflected by the mirrored surface 222, with the third optical signal 214 passing through the second filter surface 232 of the second filter 226.

The first collimating lens 236 collimates and transmits the first optical signal 210 toward the mirrored surface 222. The first collimating lens 236 is individually aligned in order to align the first optical signal 210, once reflected by the mirrored surface 222, with the second optical signal 212 passing through the first filter surface 230 of the first filter 224.

The first filter 224 is configured to both transmit the second optical signal 212 and reflect the first optical signal 210, resulting in the combined first and second optical signals 244. The second filter 226 is configured to both transmit the third optical signal 214 and reflect the combined first and second optical signals 244, resulting in the combined first, second, and third optical signals 246. The third filter 228 is configured to both transmit the fourth optical signal 216 and reflect the combined first, second, and third 246, resulting in the combined first, second, third, and fourth optical signals 248.

As disclosed in FIG. 2, the TOSA 200 may also include a beam splitter 250 positioned between the collimating lenses 236-242 and the WDM block 218, and an isolator 252 positioned between the third filter 228 and the focusing lens 243. The beam splitter 250 may transmit between about 80% and 99% of each optical signal and reflect between about 20% and about 1% of each optical signal, for example, and may be employed in connection with monitoring photodiodes (not shown). The isolator 252 reduces or prevents back reflection from reaching the lasers 202-208.

3. Example Multi-Laser TOSA Fabrication Method

Figure 3:
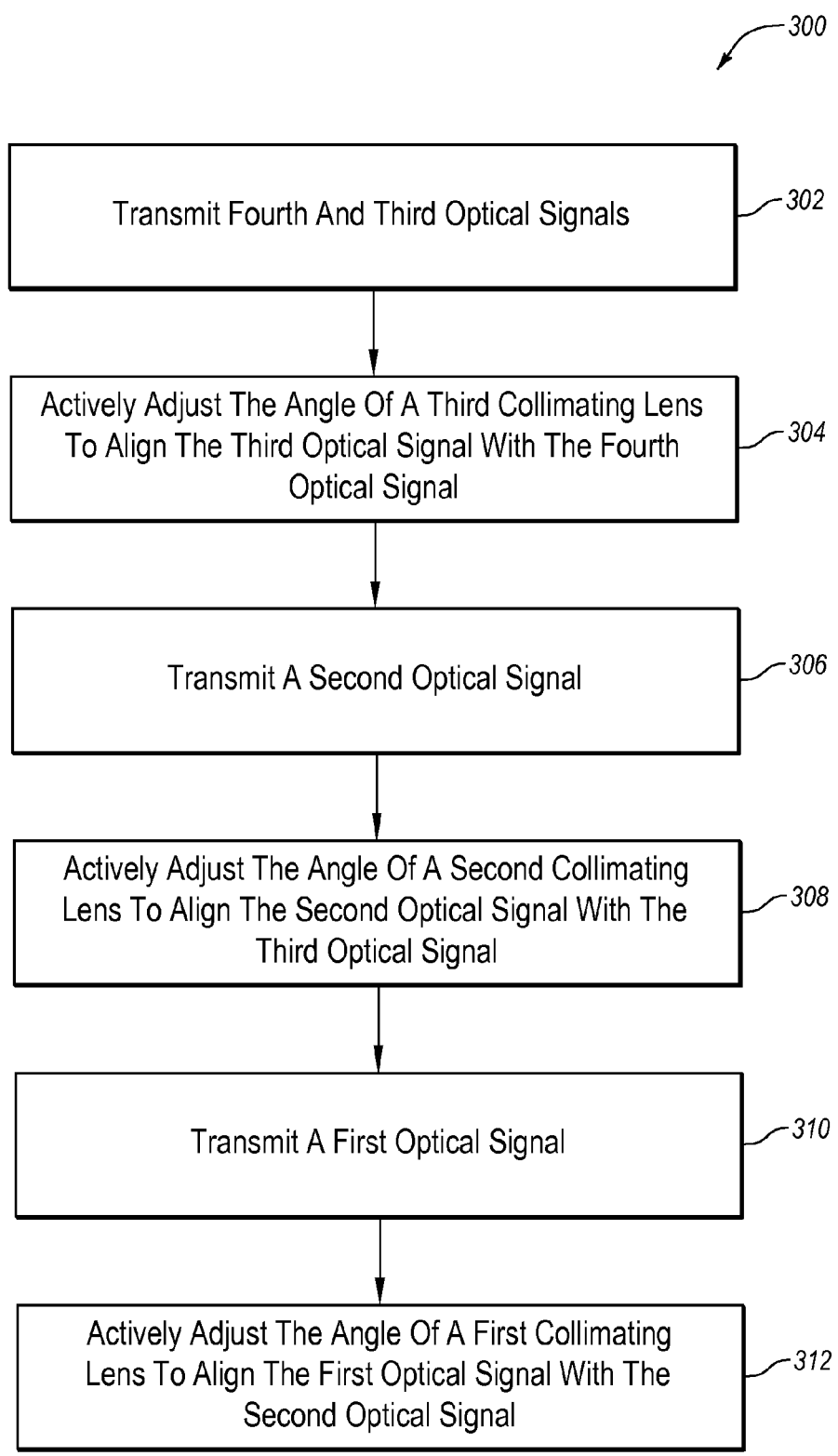
FIG. 3 is a flowchart of an example method for fabricating the multi-laser TOSA of FIGS. 1 and 2.

With continued reference to FIG. 2, and with reference also to FIG. 3, aspects of an example method 300 of fabricating the multi-laser TOSA 200 are disclosed.

At act 302, the fourth and third optical signals 216 and 214 are transmitted from the fourth and third lasers 208 and 206, respectively. For example, the fourth optical signal 216 may be transmitted through the fourth collimating lens 242, the beam splitter 250, and the third filter 228, the isolator 252, and the focusing lens 243 toward the optical fiber 120. Simultaneously, the third optical signal 214 may be transmitted through the third collimating lens 240 and the beam splitter 250 toward the second filter surface 232 of the second filter 226.

At act 304, the angle of the third collimating lens 240 is actively adjusted to cause the third optical signal 214, once reflected by the mirrored surface 222, to be aligned with the fourth optical signal 216 as the fourth optical signal 216 passes through the third filter surface 234 of the third filter 228. For example, the angle of the third collimating lens 240 can be actively adjusted and then fixed in place. The third collimating lens 240 may be fixed in place by affixing the third collimating lens 240 to a substrate (not shown) with a high-viscosity low-shrinking ultraviolet epoxy and then curing the epoxy once the third collimating lens 240 has been actively adjusted. Alternatively, the third collimating lens 240 may be part of a microelectromechanical system (MEMS) lens array that is electronically tuned during active alignment.

At act 306, the second optical signal 212 is transmitted from the second laser 204. For example, the second optical signal 212 may be transmitted through the second collimating lens 238 and the beam splitter 250 toward the first filter 224.

At act 308, the angle of the second collimating lens 238 is actively adjusted to cause the second optical signal 212, once reflected by the mirrored surface 222, to be aligned with the third optical signal 214 as the third optical signal 214 passes through the second filter surface 232 of the second filter 226. For example, the angle of the second collimating lens 238 can be actively adjusted and then fixed in place in a manner similar to the active adjustment and fixing in place of the third collimating lens 240. It is noted that since the third and second collimating lenses 240 and 238 are each individually and precisely aligned, the axes off the third and second collimating lenses 240 and 238 may not be parallel once the third and second collimating lenses 240 and 238 are fixed in position.

At act 310, the first optical signal 210 is transmitted from the first laser 202. For example, the first optical signal 210 may be transmitted through the first collimating lens 236 and the beam splitter 250 toward the mirrored surface 222.

At act 312, the angle of the first collimating lens 236 is actively adjusted to cause the first optical signal 210, once reflected by the mirrored surface 222, to be aligned with the second optical signal 212 as the second optical signal 212 passes through the first filter surface 230 of the first filter 224. For example, the angle of the first collimating lens 236 can be actively adjusted and then fixed in place in a manner similar to the active adjustment and fixing in place of the third and second collimating lenses 240 and 238. It is noted that since third, second, and first collimating lenses 240-236 are each individually and precisely aligned, the axes off the third, second, and first collimating lenses 240-236 may not be parallel once the third, second, and first collimating lenses 240-236 are fixed in position.

Although not shown in FIG. 3, it is understood that the method 300 can further include acts of positioning the beam splitter 250 between the collimating lenses 236-242 and the WDM block 218, positioning the focusing lens 243 so as to be optically aligned with the third filter 228, positioning the isolator 252 between the third filter 228 and the focusing lens 243, and hermetically sealing a package around the lasers 202-208, collimating lenses 236-242, beam splitter 250, filters 224-228, WDM block 218, isolator 252, and focusing lens 243.

It is also understood that TOSA 200 could be modified to have less than or greater than four lasers, three filters, and four collimating lenses and still benefit from the individual and precise active adjustment of collimating lenses. For example, the TOSA 200 could have only two lasers, one filter, and two collimating lenses, one or both of which is/are actively adjusted. Alternatively, the TOSA 200 could have six lasers, five filters, and six collimating lenses, five or six of which are each actively adjusted. The discussion of TOSAs herein is therefore not limited to TOSAs having four lasers, three filters, and four collimating lenses.

The individual and precise active adjustment of each of the collimating lenses 236-240 in the example multi-laser TOSA 200 enables the combination of multiple optical signals with relatively low optical loss. The size and cost of the example multi-laser TOSA 200 are also relatively low compared to prior art multi-laser TOSAs. The individual and precise active adjustment of each of the collimating lenses 236-240 in the example multi-laser TOSA 200 thus enables the example multi-laser TOSA 200 to exhibit relatively small size, cost, and optical loss. Consequently, optoelectronic modules into which the example multi-laser TOSA 200 is integrated also exhibit relatively improved overall performance.

The example embodiments disclosed herein may be embodied in other specific forms. The example embodiments disclosed herein are to be considered in all respects only as illustrative and not restrictive.

What is claimed is:

1. A multi-laser transmitter optical subassembly (TOSA) comprising:
    first, second, third, and fourth lasers configured to generate first, second, third, and fourth optical signals having first, second, third, and fourth wavelengths, respectively;
    a mirror;
    first, second, and third filters having first, second, and third filter surfaces facing the mirror;
    first, second, third, and fourth collimating lenses having first, second, third, and fourth axes, respectively, two or more of the axes not being parallel to each other, the first, second, third, and fourth collimating lenses each individually adjusted and aligned to collimate and transmit the first, second, third, and fourth optical signals, respectively; and
    a focusing lens,
    wherein the first collimating lens is configured to align the first optical signal with the second optical signal passing through the first filter, the first filter is configured to combine the first and second optical signals, the second collimating lens is configured to align the second optical signal with the third optical signal passing through the second filter, the second filter is configured to combine the first, second, and third optical signals, the third collimating lens is configured to align the third optical signal with the fourth optical signal passing through the third filter, and the third filter is configured to both combine the first, second, third, and fourth optical signals and transmit the combined first, second, third, and fourth optical signals toward the focusing lens.

2. The multi-laser TOSA as recited in claim 1, further comprising a wavelength division multiplexing (WDM) block having a first surface to which the first, second, and third filter surfaces of the first, second, and third filters, respectively, are attached.

3. The multi-laser TOSA as recited in claim 2, wherein the mirror comprises a second surface of the WDM block having a mirror coating.

4. The multi-laser TOSA as recited in claim 3, wherein the first and second surfaces of the WDM block are substantially parallel to each other.

5. The multi-laser TOSA as recited in claim 1, further comprising a beam splitter positioned between the collimating lenses and the filters.

6. The multi-laser TOSA as recited in claim 5, wherein the beam splitter is configured to transmit between about 80% and 99% of each optical signal and reflect between about 20% and about 1% of each optical signal.

7. The multi-laser TOSA as recited in claim 1, further comprising an isolator positioned between the third filter and the focusing lens.

8. The multi-laser TOSA as recited in claim 1, wherein the first, second, and third filter surfaces are substantially positioned in the same plane.

9. The multi-laser TOSA as recited in claim 1, wherein three of the axes are not parallel to each other.

10. The multi-laser TOSA as recited in claim 1, wherein all four axes are not parallel to each other.

11. An optoelectronic transceiver module comprising:
    a printed circuit board;
    a receiver optical subassembly (ROSA) in electrical communication with the printed circuit board; and
    a multi-laser TOSA in electrical communication with the printed circuit board, the multi-laser TOSA comprising:
    first, second, third, and fourth lasers configured to generate first, second, third, and fourth optical signals having first, second, third, and fourth wavelengths, respectively;
    a mirror;
    first, second, and third filters having first, second, and third filter surfaces facing the mirror;
    a collimating lens array including first, second, third, and fourth collimating lenses having first, second, third, and fourth axes, respectively, two or more of the axes not being parallel to each other, the first, second, third, and fourth collimating lenses each individually adjusted and aligned to collimate and transmit the first, second, third, and fourth optical signals, respectively; and
    a focusing lens,
    wherein the first collimating lens is configured to align the first optical signal with the second optical signal passing through the first filter, the first filter is configured to combine the first and second optical signals, the second collimating lens is configured to align the second optical signal with the third optical signal passing through the second filter, the second filter is configured to combine the first, second, and third optical signals, the third collimating lens is configured to align the third optical signal with the fourth optical signal passing through the third filter, and the third filter is configured to both combine the first, second, third, and fourth optical signals and transmit the combined first, second, third, and fourth optical signals toward the focusing lens.

12. The optoelectronic transceiver module as recited in claim 11, further comprising a WDM block having a first surface to which the first, second, and third filter surfaces of the first, second, and third filters, respectively, are attached, and wherein the mirror comprises a second surface of the WDM block having a mirror coating.

13. The optoelectronic transceiver module as recited in claim 12, wherein the first and second surfaces of the WDM block are substantially parallel to each other.

14. The optoelectronic transceiver module as recited in claim 11, further comprising a beam splitter positioned between the collimating lens array and the filters, wherein the beam splitter is configured to transmit between about 80% and 99% of each optical signal and reflect between about 20% and about 1% of each optical signal.

15. The optoelectronic transceiver module as recited in claim 11, further comprising an isolator positioned between the third filter and the focusing lens.

* * * * *